(12) United States Patent
Houston et al.

(10) Patent No.: US 6,982,915 B2
(45) Date of Patent: Jan. 3, 2006

(54) SRAM WITH TEMPERATURE-DEPENDENT VOLTAGE CONTROL IN SLEEP MODE

(75) Inventors: Theodore W. Houston, Richardson, TX (US); Luan Dang, Richardson, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 146 days.

(21) Appl. No.: 10/745,429

(22) Filed: Dec. 22, 2003

(65) Prior Publication Data

US 2005/0135175 A1   Jun. 23, 2005

(51) Int. Cl.
*G11C 7/04*   (2006.01)
(52) U.S. Cl. ............... 365/211; 365/229; 323/315; 323/316; 327/512; 327/513
(58) Field of Classification Search ............... 365/211, 365/229; 323/315, 316; 327/512, 513
See application file for complete search history.

(56) References Cited

U.S. PATENT DOCUMENTS

| | | | |
|---|---|---|---|
| 5,563,502 A | * | 10/1996 | Akioka et al. ............... 323/313 |
| 6,856,566 B2 | * | 2/2005 | Takahashi et al. .......... 365/222 |
| 6,933,769 B2 | * | 8/2005 | Koelling .................... 327/538 |

* cited by examiner

*Primary Examiner*—Richard Elms
*Assistant Examiner*—Toan Le
(74) *Attorney, Agent, or Firm*—Rose Alyssa Keagy; W. James Brady, III; Frederick J. Telecky, Jr.

(57) ABSTRACT

An electronic device (10), comprising a plurality of data storage cells (12), collectively operable in a data access mode and separately in a sleep mode. The sleep mode comprises a period of time during which the plurality of data cells are not accessed and during which a data state stored in each cell in the plurality of data cells is to be maintained at a valid state. The electronic device further comprises circuitry (18') for providing at least one temperature-dependent voltage to at least one storage device in each cell in the plurality of data storage cells during the sleep mode.

33 Claims, 2 Drawing Sheets

SRAM WITH TEMPERATURE-DEPENDENT VOLTAGE CONTROL IN SLEEP MODE

CROSS REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic devices and circuits and are more particularly directed to a static random access memory ("SRAM") with a temperature-dependent voltage control in its sleep mode.

Electronic circuits have become prevalent in numerous applications, including uses for devices in personal, business, and other environments. Demands of the marketplace affect many aspects of the design of these circuits, including factors such as device power consumption and cost of operation. Various of these electronic circuits include some aspect of digital signal processing and, quite often, these circuits include storage devices or memories. One type of popular memory is the SRAM. An SRAM has a static nature, that is, it does not require the data in each of its memory cells to be refreshed, which is required by way of contrast in a dynamic RAM ("DRAM"). Typically, the SRAM is also considered faster and more reliable than DRAM, and indeed it has found favor in numerous uses, including uses in cache memory.

With the prevalence of SRAM memory in numerous devices and applications, the SRAM also is subject to the above-introduced factors of power consumption and cost of operation. In this regard, the prior art now includes a so-called "sleep mode" of operation of the SRAM, which also is sometimes referred to with other terms such as "standby mode" or possibly still others. This mode is characterized as a period of time in which the data cells in the SRAM will not be accessed (i.e., either read or written), but the data state in each cell must be maintained because it is anticipated that eventually the operation of the SRAM will discontinue from the sleep mode, at which time the data previously stored therein will be needed; hence, there is a need to maintain the validity of that data during the sleep mode. With these considerations, the sleep mode typically is further characterized in that the voltage provided to the SRAM array of memory cells is reduced during the sleep mode as compared to the voltage supplied during all access operations. The reduction is typically to a level on the order of one-half of the voltage provided during data access operations of the SRAM, where the voltage applied to the SRAM array (often referred to as VDDA) during the data access operations is often set to a value referred to as $V_{DD}$; thus, during the sleep mode, the voltage $V_{DDA}$ provided to the SRAM array is on the order of 0.5 $V_{DD}$. In the prior art, the specific amount of reduction of $V_{DDA}$, such as to a value of 0.5 $V_{DD}$, is typically determined by the designer to accommodate worst case scenarios. For example, with the anticipated range of environmental and circuit conditions such as temperature, silicon variations, and the like, the reduced value of $V_{DDA}$ is fixed at a level to ensure that the data state is maintained in each SRAM array cell during the sleep mode, while also accommodating any change in the environmental and circuit conditions.

While the above-described approaches have proven workable in various implementations, the present inventors have observed that the prior art may be improved. Specifically, in connection with the present preferred embodiments, it has been observed that as the temperature to which an SRAM is exposed decreases, the amount of voltage required to maintain the data state in the SRAM cells increases. Thus, with the fixed-voltage levels in the standby mode of the prior art, the supply voltage for the standby mode is presumably established in contemplation of a worst-case scenario, that is, in respect to the voltage required at the lowest temperature anticipated to be experienced by the SRAM data cells (with whatever additional tolerance). However, the present inventors have recognized that when the SRAM is in standby mode and experiences higher temperatures, then the preestablished fixed voltage supply to the SRAM will necessarily cause a certain amount of current leakage across the SRAM array. Of course, current leakage is undesirable for various reasons, including increased power consumption and operational cost. Thus, the preferred embodiments as set forth below seek to improve upon the prior art as well as these associated drawbacks.

BRIEF SUMMARY OF THE INVENTION

In one preferred embodiment, there is an electronic device, comprising a plurality of data storage cells, collectively operable in a data access mode and separately in a sleep mode. The sleep mode comprises a period of time during which the plurality of data cells are not accessed and during which a data state stored in each cell in the plurality of data cells is to be maintained at a valid state. The electronic device further comprises circuitry for providing at least one temperature-dependent voltage to at least one storage device in each cell in the plurality of data storage cells during the sleep mode.

In another preferred embodiment, there is a method supplying voltage to an electronic device, the electronic device comprising a plurality of data storage cells, collectively operable in a data access mode and separately in a sleep mode. The method comprises a set of steps comprising coupling a first voltage to at least one storage device in each cell in the plurality of data storage cells during the sleep mode and at a first temperature, and coupling a second voltage to the at least one storage device in each cell in the plurality of data storage cells during the sleep mode and at a second temperature, wherein the second temperature differs from the first temperature.

Other aspects are also disclosed and claimed.

BRIEF DESCRIPTION OF THE SEVERAL VIEWS OF THE DRAWING

FIG. 3a illustrates a plot demonstrating one preferred embodiment temperature-dependent voltage provided to the SRAM array of FIG. 1 during the sleep mode.

DETAILED DESCRIPTION OF THE INVENTION

Figure 1:
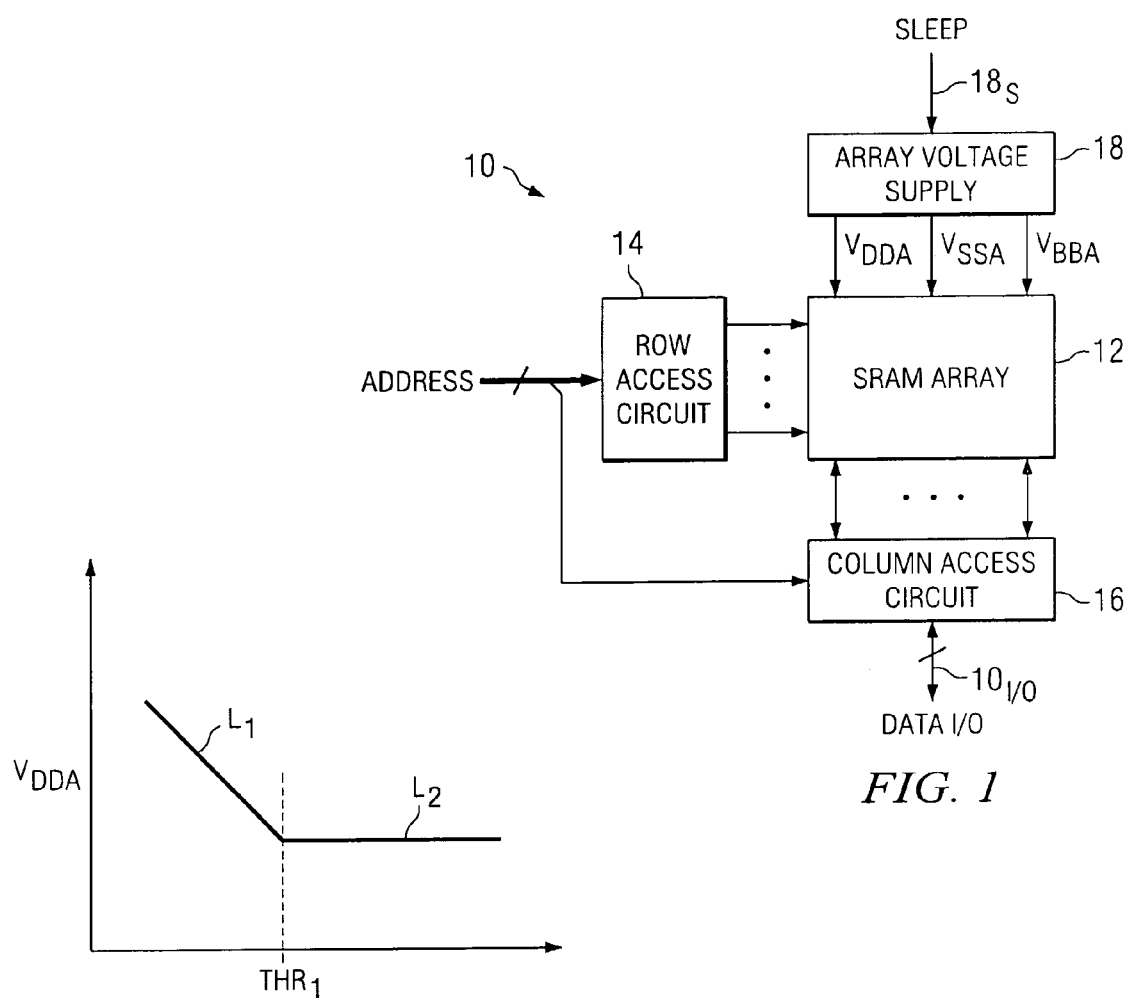
FIG. 1 illustrates a block diagram of a static random access memory ("SRAM") system designated generally at 10 and according to the preferred embodiments.

FIG. 1 illustrates a block diagram of a memory system designated generally at 10 and according to the preferred embodiments. In one preferred embodiment, system 10 is constructed using a single integrated circuit and, indeed, additional circuitry is likely included within such an integrated circuit. However, to simplify the present illustration and discussion, such additional circuitry is neither shown nor described. Moreover, system 10 may be implemented in connection with numerous digital data systems, as ascertainable by one skilled in the art.

Looking to the blocks in system 10, system 10 includes various items which in general are also known in the prior art, but additional control and operation as detailed later distinguishes the overall system. Looking by way of introduction to some of the blocks that are comparable to the prior art, they include an SRAM array 12. SRAM array 12 is intended to demonstrate a collection of SRAM memory cells that are typically aligned in an array fashion, that is, to include either or both a physical and logical orientation wherein the memory cells are addressed according to a number R of rows and a number C of columns. The values of R and C may vary widely based on implementations. Each of the R×C memory cells may be constructed according to various techniques known to or ascertainable by one skilled in the art. An ADDRESS signal is coupled to a row access circuit 14 and a column access circuit 16. Collectively, row access circuit 14 and column access circuit 16 facilitate the reading and writing of cells in SRAM array 12, where the particular cells accessed in a given cycle are determined by the ADDRESS. The manner in which a row or rows, and some or all of the columns in a row or rows, are accessed in a given cycle also may vary. In any event, addressed cells are either written or read as indicated at the DATA input/output $10_{I/O}$ of FIG. 1, where typically such I/O is provided in connection with the column access of the array.

Turning now to an inventive aspect of FIG. 1 and which also combines with system 10 so as to provide an overall novel and improved system, system 10 includes an array voltage supply block 18. In the preferred embodiment, array voltage supply block 18 provides one or more array voltages to the data storage cells of SRAM array 12, where by way of a preferred example, three such system voltages are shown in FIG. 1. These three voltages include the array high supply voltage $V_{DDA}$, the array low supply voltage $V_{SSA}$, and an array back bias voltage $V_{BBA}$. As known in the art, the array high and low supply voltages, $V_{DDA}$ and $V_{SSA}$, respectively, may be connected to various devices, such as selected source, drain, and/or gate nodes of various transistors within SRAM array 12, as may the low supply voltage, $V_{SSA}$. Further, the array back bias voltage $V_{BBA}$, may connect to the backgates or other appropriate threshold voltage connections of at least some of the transistors in SRAM array 12. Further in this regard, while a single back bias voltage, $V_{BBA}$, is shown in FIG. 1, in one preferred embodiment two separate back bias voltages are provided, one for p-channel transistors and one for n-channel transistors, where as known in the art a different back bias voltage is generally applied to p-channel transistors compared to the back bias voltage applied to n-channel transistors, and a different amount of voltage adjustment is required to cause an equal change in the threshold voltage of these different conductivity type devices. In an alternative embodiment, $V_{BBA}$ may be adjusted with respect to p-channel transistors while an increase in $V_{SSA}$ relative to substrate voltage may be used to increase a back bias on n-channel transistors so as to increase the threshold voltage of those transistors. Lastly, and for reasons evident below, array voltage supply block 18 also includes an input $18_S$ for receiving a SLEEP signal.

The particular operation of array voltage supply block 18 is now explored and provides an inventive aspect as will be appreciate by one skilled in the art. Specifically, during data access operation of system 10, array voltage supply block 18 may provide the array voltages, $V_{DDA}$, $V_{SSA}$, and $V_{BBA}$, according to techniques and methodologies as known in the art. However, the preferred embodiments contemplate that the SLEEP signal is asserted when it is desired for system 10 to enter into a sleep mode of operation, that is, a period of time where it is known that the data cells in SRAM array 12 will not be accessed (i.e., either read or written), but where it is required that each cell maintain its valid data state. The assertion of the SLEEP signal in this manner may be performed according to the art. In response to asserted SLEEP signal, array voltage supply 18 adjusts one or more of the array voltages, $V_{DDA}$, $V_{SSA}$, and $V_{BBA}$, so as to reduce current consumption of the cells in SRAM array 12 during the corresponding period of standby operation. For example, $V_{DDA}$ may be decreased and/or $V_{SSA}$ may be increased to the cells. As another example, $V_{BBA}$ may be adjusted so as to increase the threshold voltage of the transistor(s) in each SRAM cell, where, for example, increasing $V_{BBA}$ of a p-channel transistor will increase its threshold voltage. Importantly, however, also in the preferred embodiment, any one or more of $V_{DDA}$, $V_{SSA}$, and $V_{BBA}$ are further adjusted according to the temperature experienced by system 10. In other words, and as further appreciated below from one preferred embodiment approach, array voltage supply 18 operates in a fashion that is deliberately temperature-dependent such that any of $V_{DDA}$, $V_{SSA}$, or $V_{BBA}$ may be altered in response to temperature. For sleep mode, the applied voltages must be set at values that will allow retention of the data while preferably reducing IDDQ. Since transistor characteristics change with temperature, the voltages required for data retention may change with temperature, and IDDQ may change with temperature. A larger voltage across the cell ($V_{DDA}$-$V_{SSA}$) may be required for data retention at lower temperature than at higher temperature. Also, for a given set of voltages, IDDQ may be higher at higher temperature than at lower temperature. Thus, these voltage alterations may be constructed so that when temperature decreases, the net voltage, $V_{DDA}$-$V_{SSA}$, applied to SRAM array 12 is increased, where in contrast when temperature increases, that net voltage, $V_{DDA}$-$V_{SSA}$, applied to SRAM array 12 is decreased. Additionally, as temperature increases, the threshold voltage of data cell transistors may decrease for a given back bias. Thus the applied back bias voltage may be adjusted to increase the threshold voltage at higher temperature and to decrease the threshold voltage at lower temperature. Note that these net voltage adjustments are such that when temperature decreases, the voltage across the cell is increased so as to maintain the valid data state in cells of SRAM array 12; however, as a benefit, when temperature increases, the net voltage is decreased and/or the threshold voltage is increased with a corresponding reduction in leakage current as compared to that which would occur if the voltage remained the same as it was at lower temperatures. Therefore, during the sleep mode of operation, array voltage supply block 18 provides a first set of voltage levels to SRAM array 12 for a first temperature, and array voltage supply block 18 provides a second set of voltage levels to SRAM array 12 for a second temperature, where the first set of voltages has at least one voltage that differs from the comparable voltage in the second set of voltages, and where the first temperature differs from the second temperature.

Figure 2:
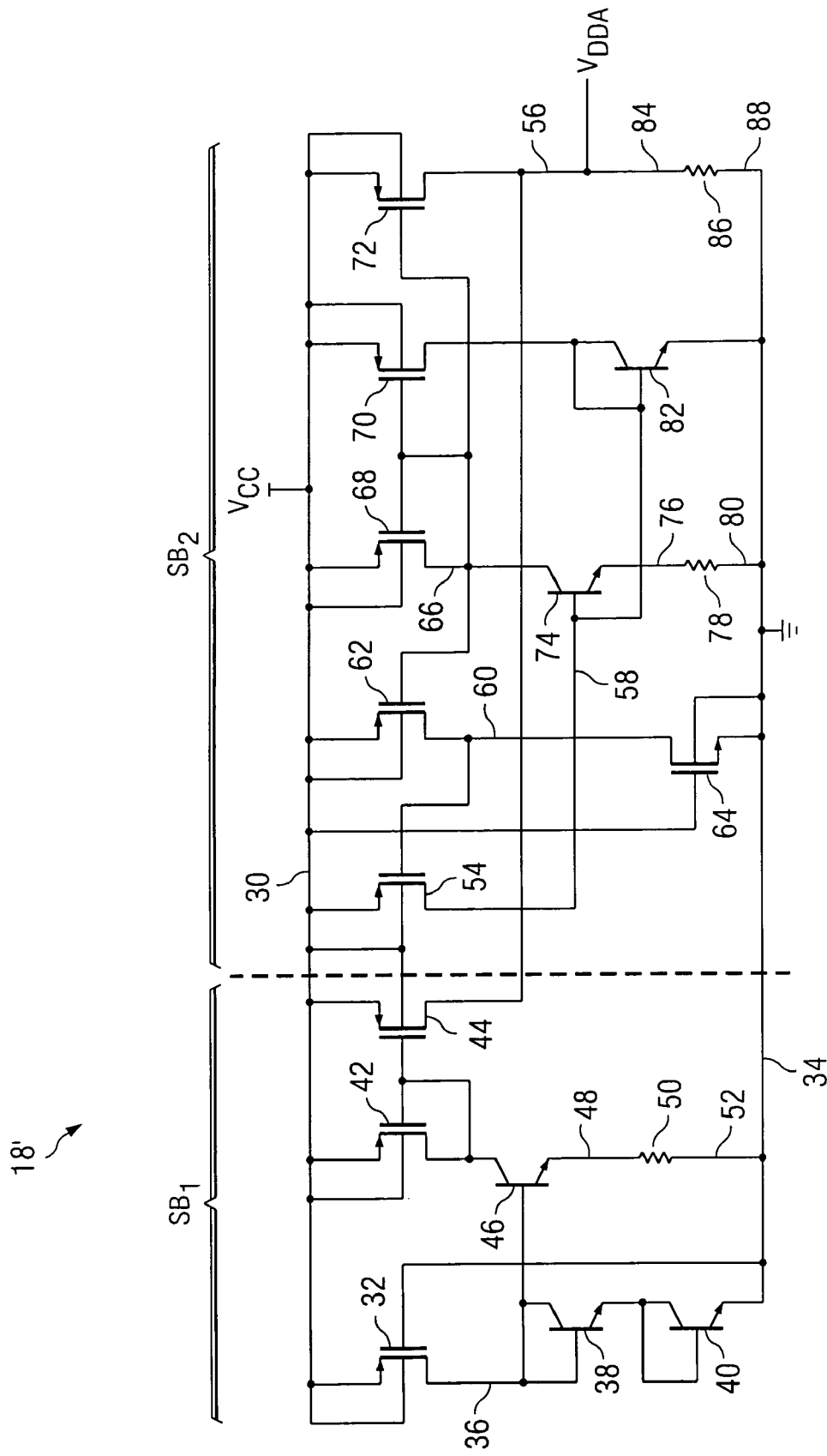
FIG. 2 illustrates a schematic for providing a temperature-dependent voltage to the SRAM array of FIG. 1 during the sleep mode.

FIG. 2 illustrates a schematic of one preferred embodiment for implementing a portion of voltage supply block 18 for sake of generating the array high supply voltage $V_{DDA}$ and which is designated as system 18'. By way of introduction, system 18' is such that the voltage $V_{DDA}$ it outputs decreases with an increase in temperature and such that this voltage increases with a decrease in temperature, consistent with the above teachings and for use when the SLEEP signal is asserted to supply 18 in FIG. 1. Looking to the connectivity of the schematic, it includes a node 30 coupled to receive a supply voltage $V_{CC}$ that preferably does not vary significantly with temperature, as may be produced by various voltage supply circuits known in the art. Looking to the left of the schematic, in general a subsystem $SB_1$ is generally segregated for sake of illustration and later functional description, and is as follows. Node 30 is connected to the source and backgate of a p-channel transistor 32, which has its gate connected to a node 34 and its drain connected to a node 36. Node 34 in the illustrated embodiment is connected to ground. Node 36 is further connected to the base and collector of a bi-polar junction transistor ("BJT") 38, which has its emitter connected to a base and collector of a BJT 40. The emitter of BJT 40 is connected to node 34. Returning to node 30, it is also connected to the source and backgate of a p-channel transistor 42, which has its gate connected to its drain and also to the gate of a p-channel transistor 44. The drain of p-channel transistor 42 is also connected to the collector of a BJT 46, which has its base connected to node 36 and its emitter connected to a first terminal (or node) 48 of a resistor 50, and where a second terminal 52 of resistor 50 is connected to node 34.

Continuing with FIG. 2, system 18' includes another subsystem $SB_2$, also segregated for sake of illustration and later functional description. In subsystem $SB_2$, node 30 is connected to the backgate of p-channel transistor 44 and also to the backgate of a p-channel transistor 54. The drain of p-channel transistor 44 is connected to a node 56, which as detailed later provides the temperature-dependent voltage, $V_{DDA}$. The drain of p-channel transistor 54 is connected to a node 58 and the gate of that p-channel transistor 54 is connected to a node 60, which is connected to the drain of a p-channel transistor 62 and the drain of an n-channel transistor 64. P-channel transistor 62 has its source and backgate connected to node 30, and its gate connected to a node 66. The gate of n-channel transistor 64 is connected to node 30 and its source and backgate are connected to node 34. Node 66 is also connected to the drain and gate of a p-channel transistor 68, having its source and backgate connected to node 30. Node 66 is also connected to the gate and drain of a p-channel transistor 70, having its source and backgate connected to node 30. Node 66 is also connected to the gate of a p-channel transistor 72, having its source and backgate connected to node 30 and its drain connected to node 56. Node 66 is also connected to the collector of a BJT 74, having its base connected to node 58 and its emitter connected to a terminal 76 of a resistor 78. Another terminal 80 of resistor 78 is connected to node 34. Returning to p-channel transistor 70, its drain is connected to the base and collector of a BJT 82, which has its emitter connected to node 34. Finally, node 56 is also connected to a terminal 84 of a resistor 86, which has another terminal 88 connected to node 34.

The operation of system 18' is now discussed, and may be appreciated by first turning to sub-system $SB_2$. In general, sub-system $SB_2$ operates as a bandgap subcircuit to provide a current that has a known dependency with temperature. Specifically, in the preferred embodiment, BJT 74 is on the order of four times the physical size of BJT 82. However, due to the current mirror produced by p-channel transistors 68 and 70, each of BJTs 74 and 82 has a same amount of current passing through the collector-emitter paths of those devices. The result of this equivalent current flow is that the base-to-emitter voltage ("VBE") is reduced through BJT 74 relative to BJT 82, since the current through BJT 74 per unit area is one-fourth that through BJT 82. Thus, there is a $\Delta V_{BE}$ between ground at node 34 and terminal 76 of resistor 78; this $\Delta V_{BE}$ may be in a slight sense temperature dependent, but may be assumed to be temperature independent at least to a first order of approximation. Given the preceding, the amount of resistance provided by resistor 78 defines the amount of current through subsystem $SB_2$, that is, the mirrored current through p-channel transistors 68 and 70. The current through resistor 78 is also mirrored through resistor 86; also, note that resistors 78 and 86 are preferably matched in terms of fabrication, but in terms of resistance one may be a multiple of the other. Likewise, therefore, the current mirrored through resistor 78 and resistor 86 may be the same or one may be a multiple of the other. In any event, therefore, subsystem $SB_2$ primarily contributes a temperature-dependent current through resistor 86, which is inversely proportional to its resistance, thereby providing $V_{DDA}$ in this respect as a temperature-independent voltage. Thus, subsystem $SB_2$ may be provided so as to provide a substantially temperature-independent $V_{DDA}$ over a certain range of temperatures, such as for higher operating temperatures of memory system 10.

Continuing with the operation of system 18', attention is now directed to sub-system $SB_1$. In general and as further detailed below, sub-system $SB_1$ operates to contribute to system 18' a characteristic of a voltage that is temperature-dependent so that this element may be used to include temperature dependence into $V_{DDA}$ below a certain desirable temperature threshold. With this inclusion, therefore, $V_{DDA}$ may be increased either linearly or otherwise below the desired temperature threshold during the standby mode of system 10, thereby providing sufficient voltage to maintain data in SRAM array 12 during that mode, whereas when the temperature increases above the desirable temperature threshold during the standby mode, the effect of sub-system $SB_1$ is minimized or avoided, thereby leaving the reduced and relatively fixed or temperature-independent characteristic of $V_{DDA}$ as provided by sub-system $SB_2$ so as to also maintain state in SRAM array 12 while also decreasing leakage current as compared to that which would occur if the voltage were left at a higher range as is provided with the inclusion of the characteristic of sub-system $SB_1$ at lower temperatures. The details of such operation of subsystem $SB_1$ are further appreciated below.

Looking now in greater detail to the operation of sub-system $SB_1$, a current is generated through p-channel transistor 32, and this current is mirrored through BJTs 38 and 46, thereby providing a same voltage at the emitter of each of BJTs 38 and 46. Thus, the voltage across resistor 50 is the same as a $V_{BE}$ across BJT 40. Note, however, that the temperature coefficient of the $V_{BE}$ across BJT 40 will vary considerably with temperature. For example, the $V_{BE}$ may be 0.9 volts at −40 degrees Celsius and 0.4 volts at 150 degrees Celsius. Further, the resistance of resistor 50 increases with temperature. Thus, at lower temperatures, these factors combine to produce more current in the current mirror output that includes p-channel transistors 42 and 44. This current may be scaled and is added to the current from p-channel transistor 72 (in subsystem $SB_2$), and this combined current passes through resistor 86, thereby contributing to the voltage, $V_{DDA}$, across that resistor 86. Thus, the temperature dependence of subsystem $SB_1$ combines with the relative temperature independence of subsystem $SB_2$. Accordingly, a characteristic of $V_{DDA}$ may have the shape as shown as a simplified example in FIG. 3a. Particularly, FIG. 3a plots $V_{DDA}$ with respect to temperature, as produced by system 18'. As seen, below a temperature threshold $THR_1$, $V_{DDA}$ is fairly linear along a first line $L_1$, and that line indicates that $V_{DDA}$ increases with a decrease in temperature, as achieved through the added functionality provided by subsystem $SB_1$. Above voltage threshold $THR_1$, $V_{DDA}$ is also linear, but along a second and different line $L_2$. Also, while not shown, the transition between lines $L_1$ and $L_2$ may include a curved transition. In any event, $V_{DDA}$ along line $L_2$ is fairly temperature-independent, as provided by subsystem $SB_2$, in a range of temperature above $THR_1$ where the effect of subsystem $SB_1$ is substantially reduced or eliminated. In other words, FIG. 3a illustrates that for system 18', $V_{DDA}$ is generated by the adding of a constant current and a temperature-dependent current through resistor 86. In the low temperature region below threshold $THR_1$, the temperature-dependent current is larger and predominantly determines the voltage, thereby increasing $V_{DDA}$ as temperature decreases below threshold $THR_1$. In the high temperature region, the constant current is larger and predominantly determines the voltage, thereby maintaining $V_{DDA}$ as a relative constant above threshold $THR_1$. At the transition region between lines $L_1$ and $L_2$, the two currents are of comparable magnitude. In all events, it may be seen that lines $L_1$ and $L_2$ provide a range for $V_{DDA}$, whereby generally at lower temperatures the provided voltage is greater than that at higher temperatures, thereby providing the operation and benefits described above.

Figure 3B:
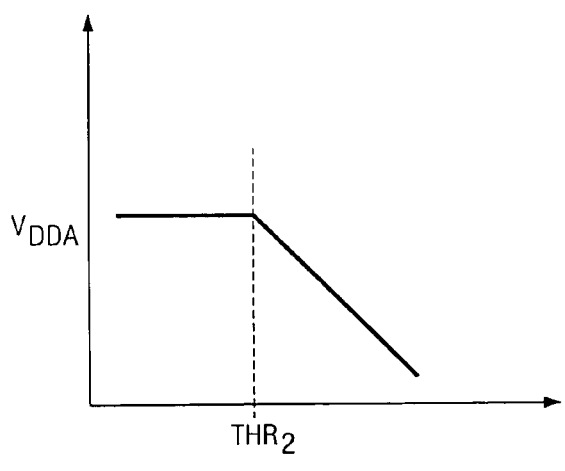
FIG. 3b illustrates an alternative plot demonstrating temperature-dependent voltage that may be provided to the SRAM array of FIG. 1 during the sleep mode.
Figure 3C:
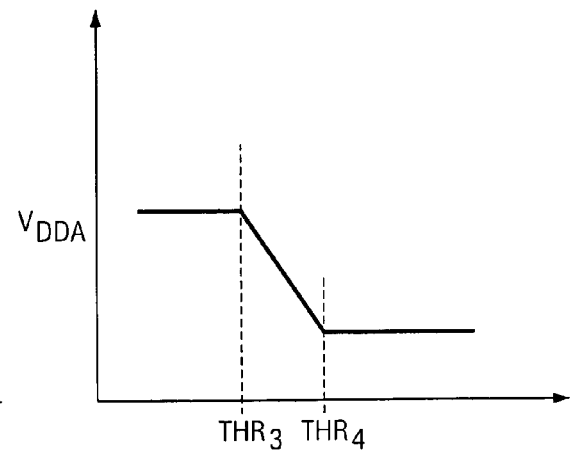
FIG. 3c illustrates another alternative plot demonstrating temperature-dependent voltage that may be provided to the SRAM array of FIG. 1 during the sleep mode.

In addition to the preceding, note further that in the preferred embodiments $V_{DDA}$ may be supplied relative to $V_{SSA}$. Thus the voltage across the cell may be increased at lower temperature by increasing $V_{DDA}$ as shown in FIG. 3a, or by lowering $V_{SSA}$ while holding $V_{DDA}$ constant. Any combination of raising or lowering $V_{DDA}$ and raising or lowering $V_{SSA}$ may be used to obtain the desired voltage across the cell as a function of temperature. This may be done in conjunction with adjustment of back bias voltages or with constant back bias voltages to adjust the threshold voltages of the n-channel and p-channel transistors. For example, for a given $V_{BBA}$ applied as back bias to the p-channel transistors and a given substrate voltage applied to the n-channel transistors, raising $V_{DDA}$ and $V_{SSA}$ together will lower the magnitude of the p-channel transistor threshold voltage and increase the magnitude of the n-channel transistor threshold voltage. Still further, note that the preceding techniques, with respect to $V_{DDA}$, $V_{SSA}$, and/or $V_{BBA}$, may be applied based on other plots of voltage change with temperature. For example, FIGS. 3b and 3c illustrate alternative plots demonstrating temperature-dependent voltage that may be provided to the SRAM array of FIG. 1 during the sleep mode. Briefly, therefore, FIG. 3b illustrates a first range of temperature below a threshold $THR_2$ wherein $V_{DDA}$ is constant, and it further illustrates a second range of temperature above threshold $THR_2$ wherein $V_{DDA}$ decreases linearly with temperature. As another alternative, FIG. 3c illustrates different voltage characteristics across three temperature ranges. In a first range of temperature below a threshold $THR_3$, $V_{DDA}$ is constant, and in a second range of temperature above a threshold $THR_4$, $V_{DDA}$ is also constant. However, between temperatures $THR_3$ and $THR_4$ is a third range of temperature wherein $V_{DDA}$ decreases linearly with temperature.

From the above, it may be appreciated that the above embodiments provide an SRAM with a temperature-dependent voltage control in its sleep mode. The SRAM provides particular benefits over the prior art. For example, current consumption during the sleep mode is reduced as compared to the prior art. This reduction leads to corresponding benefits, such as reduced power consumption and reduced cost of operation. These benefits may be particularly advantageous in battery-operated applications, which are quite common in contemporary applications. As another benefit, the present inventive teachings may be applied to numerous forms of SRAMs and in the numerous devices into which such SRAMs are included. As yet another benefit, while FIG. 2 illustrates one approach to providing a temperature-dependent form of $V_{DDA}$, one skilled in the art may ascertain other approaches as well as circuits for providing a temperature-dependent form of $V_{SSA}$ and/or $V_{BBA}$. Still further, rather than using current sources to provide a temperature-dependent form for any one or more of $V_{DDA}$, $V_{SSA}$, and $V_{BBA}$, such a voltage or voltages may be provided by a number of voltage sources, where different ones of the voltage sources have different temperature dependencies. Thus, these benefits further demonstrates the flexibility of the preferred embodiments, and further demonstrate that while the present embodiments have been described in detail, various substitutions, modifications or alterations could be made to the descriptions set forth above without departing from the inventive scope which is defined by the following claims.

What is claimed is:

1. An electronic device, comprising:
 a plurality of data storage cells, collectively operable in a data access mode and separately in a sleep mode, wherein the sleep mode comprises a period of time during which the plurality of data cells are not accessed and during which a data state stored in each cell in the plurality of data cells is to be maintained at a valid state; and
 circuitry for providing at least one temperature-dependent voltage to at least one storage device in each cell in the plurality of data storage cells during the sleep mode.

2. The device of claim 1 wherein the circuitry for providing at least one temperature-dependent voltage is for providing the at least one temperature-dependent voltage to have a first magnitude at a first temperature and for providing the at least one temperature-dependent voltage to have a second magnitude at a second temperature that is greater than the first temperature, wherein the first magnitude is greater than the second magnitude.

3. The device of claim 2 wherein the at least one temperature-dependent voltage comprises an array high supply voltage.

4. The device of claim 3 wherein the circuitry for providing at least one temperature-dependent voltage comprises:
 a first circuit for providing a temperature-dependent voltage across a first range of temperature that includes the first temperature; and a second circuit for providing a temperature-independent voltage, at least to a first order of approximation, across a second range of temperature that includes the second temperature.

5. The device of claim 4 wherein each cell in the plurality of data storage cells comprises a static random access memory cell.

6. The device of claim 2 wherein the circuitry for providing at least one temperature-dependent voltage comprises:
   a first circuit for providing a temperature-dependent voltage across a first range of temperature that includes the first temperature; and
   a second circuit for providing a temperature-independent voltage, at least to a first order of approximation, across a second range of temperature that includes the second temperature.

7. The device of claim 1 wherein the circuitry for providing at least one temperature-dependent voltage is for providing a net voltage formed by a difference between an array high supply voltage and an array low supply voltage.

8. The device of claim 7 wherein the circuitry for providing at least one temperature-dependent voltage is for providing the net voltage to have a first magnitude at a first temperature and for providing the net voltage to have a second magnitude at a second temperature that is greater than the first temperature, wherein the first magnitude is greater than the second magnitude.

9. The device of claim 1 wherein the circuitry for providing at least one temperature-dependent voltage is for providing the at least one temperature-dependent voltage as a threshold voltage altering voltage.

10. The device of claim 9:
    wherein the circuitry for providing at least one temperature-dependent voltage is for providing the threshold voltage altering voltage as a first threshold voltage altering voltage causing a transistor coupled to receive the first threshold voltage altering voltage to have a first threshold voltage at a first temperature and for providing the threshold voltage altering voltage as a second threshold voltage altering voltage causing a transistor coupled to receive the second threshold voltage altering voltage to have a second threshold voltage at a second temperature;
    wherein the second temperature that is greater than the first temperature; and
    wherein, in response to the first and second threshold altering voltages, the transistor is caused to have a greater threshold voltage at the second temperature than at the first temperature.

11. The device of claim 9 wherein the threshold voltage altering voltage is coupled to a backgate of at least one transistor in each cell in the plurality of data storage cells.

12. The device of claim 1 wherein the plurality of data storage cells comprises an array of data storage cells having a number of rows and a number of columns.

13. The device of claim 12 wherein each cell in the plurality of data storage cells comprises a static random access memory cell.

14. The device of claim 1 wherein each cell in the plurality of data storage cells comprises a static random access memory cell.

15. The device of claim 1 wherein the circuitry for providing at least one temperature-dependent voltage is operable to adjust the temperature-dependent voltage as required to maintain data in the plurality of data storage cells over a temperature range.

16. The device of claim 1 wherein the circuitry for providing at least one temperature-dependent voltage is operable to adjust the temperature-dependent voltage so as to reduce variation of IDDQ over temperature compared to a range of IDDQ that would occur if the temperature-dependent voltage were held constant.

17. The device of claim 1 wherein the temperature-dependent voltage is controlled relative to a second voltage.

18. The device of claim 1 wherein the circuitry for providing at least one temperature-dependent voltage is further for providing a second voltage, wherein a difference between the at least one temperature-dependent voltage and the second voltage at a first temperature is greater than a difference between the at least one temperature-dependent voltage and the second voltage at a second temperature, wherein the first temperature is lower than the second temperature.

19. The device of claim 1 wherein the temperature-dependent voltage is generated from a temperature-dependent current.

20. The device of claim 19:
    wherein the temperature-dependent current is a sum of currents provided by a plurality of current sources; and
    wherein each current source in the plurality of current sources has a different respective temperature-dependency.

21. The device of claim 1 wherein the temperature-dependent voltage is generated from a temperature-dependent voltage source.

22. The device of claim 21:
    wherein the temperature-dependent voltage is further provided by a plurality of temperature-dependent voltage sources that include the temperature-dependent voltage source; and
    wherein each temperature-dependent voltage source in the plurality of temperature-dependent voltage sources has a different respective temperature-dependency.

23. A method of supplying voltage to an electronic device, the electronic device comprising a plurality of data storage cells, collectively operable in a data access mode and separately in a sleep mode, wherein the sleep mode comprises a period of time during which the plurality of data cells are not accessed and during which a data state stored in each cell in the plurality of data cells is to be maintained at a valid state, the method comprising a set of steps comprising:
    coupling a first voltage to at least one storage device in each cell in the plurality of data storage cells during the sleep mode and at a first temperature;
    coupling a second voltage to the at least one storage device in each cell in the plurality of data storage cells during the sleep mode and at a second temperature, wherein the second temperature differs from the first temperature.

24. The method of claim 23:
    wherein the second temperature is greater than the first temperature; and
    wherein the second voltage causes each cell to which the second voltage is connected to have a reduced amount of current leakage as compared to an amount of current leakage that would pass through the cell if the cell were connected, at the second temperature, to the first voltage.

25. The method of claim 24 wherein the first voltage and the second voltage both comprise an array high supply voltage.

26. The method of claim 24 wherein the first voltage and the second voltage both comprise a net voltage of an array high supply voltage minus an array low supply voltage.

27. The method of claim 24 wherein the first voltage and the second voltage both comprise a backbias voltage.

28. The method of claim 24 wherein the steps of coupling a first voltage and coupling a second voltage both comprise coupling a voltage to each cell in a plurality of static data storage cells.

29. The method of claim 23 wherein the steps of coupling a first voltage and coupling a second voltage both comprise coupling a voltage to each cell in a plurality of static data storage cells.

30. A method of supplying voltage to a memory array over a temperature range, comprising the steps of:
   providing voltage to supply a first voltage difference at a first temperature; and
   providing voltage to supply a second voltage difference at a second temperature;
   wherein the second voltage difference is larger than the first voltage difference and the second temperature is different than the first temperature; and
   wherein the second voltage difference at the second temperature is needed to retain data in the memory array relative to the first voltage difference needed to retain data in the memory array at the first temperature.

31. The method of claim 30 wherein the steps of providing voltage to supply a first voltage difference and providing voltage to supply a second voltage difference are provided when the memory array is in a sleep mode.

32. A method of supplying voltage to a memory array over a temperature range, comprising:
   providing to the memory array a first voltage at a first time;
   providing to the memory array a second voltage at a second time; and
   wherein the first voltage is adjusted to the second voltage to reduce IDDQ at a temperature at which IDDQ would increase relative to IDDQ at another temperature if the voltage were not adjusted.

33. The method of claim 32 wherein the steps of providing a first voltage and providing a second voltage are provided when the memory array is in a sleep mode.

\* \* \* \* \*